United States Patent
Anderson et al.

(10) Patent No.: US 9,574,767 B2
(45) Date of Patent: Feb. 21, 2017

(54) COMBUSTION-POWERED ELECTRODYNAMIC COMBUSTION SYSTEM

(71) Applicant: CLEARSIGN COMBUSTION CORPORATION, Seattle, WA (US)

(72) Inventors: Kraig K. Anderson, San Mateo, CA (US); Christopher A. Wiklof, Everett, WA (US); Lon E. Bell, Altadena, CA (US)

(73) Assignee: CLEARSIGN COMBUSTION CORPORATION, Seattle, WA (US)

( * ) Notice: Subject to any disclaimer, the term of this patent is extended or adjusted under 35 U.S.C. 154(b) by 0 days.

(21) Appl. No.: 14/901,668

(22) PCT Filed: Jul. 8, 2014

(86) PCT No.: PCT/US2014/045795
§ 371 (c)(1),
(2) Date: Dec. 28, 2015

(87) PCT Pub. No.: WO2015/017087
PCT Pub. Date: Feb. 5, 2015

(65) Prior Publication Data
US 2016/0138800 A1    May 19, 2016

Related U.S. Application Data

(60) Provisional application No. 61/859,560, filed on Jul. 29, 2013.

(51) Int. Cl.
*F02G 5/00* (2006.01)
*F23C 99/00* (2006.01)
(Continued)

(52) U.S. Cl.
CPC ............ *F23C 99/001* (2013.01); *F01B 23/10* (2013.01); *F01D 15/10* (2013.01); *F02G 1/04* (2013.01);
(Continued)

(58) Field of Classification Search
CPC ....................................................... F23C 99/01
(Continued)

(56) References Cited

U.S. PATENT DOCUMENTS 2,604,936 A     7/1952   Kaehni et al.
3,087,472 A *   4/1963   Asakawa ................ F02B 51/04
                                                        123/1 R
(Continued)

FOREIGN PATENT DOCUMENTS

EP          0844434         5/1998
EP          2738460         6/2014
(Continued)

OTHER PUBLICATIONS

PCT International Search Report and Written Opinion of International PCT Application No. PCT/US2014/045795 mailed Oct. 30, 2014.

*Primary Examiner* — Joseph Waks
(74) *Attorney, Agent, or Firm* — Christopher A. Wiklof; Launchpad IP, Inc.

(57) ABSTRACT

Technologies are provided for employing electrical energy to control a combustion reaction. Energy is received from a combustion reaction. A portion of the received energy is converted to generated electricity. The generated electricity converted from the combustion energy is used to control the combustion reaction.

69 Claims, 14 Drawing Sheets

(51) Int. Cl.
| | | |
|---|---|---|
| *F01D 15/10* | (2006.01) | |
| *F02G 1/04* | (2006.01) | |
| *H01L 31/042* | (2014.01) | |
| *F01B 23/10* | (2006.01) | |
| *H02K 44/08* | (2006.01) | |

(52) U.S. Cl.
CPC .............. *F02G 5/00* (2013.01); *H01L 31/042* (2013.01); *H02K 44/085* (2013.01); *Y02E 10/50* (2013.01)

(58) Field of Classification Search
USPC .................................................. 431/2; 60/772
See application file for complete search history.

(56) References Cited

U.S. PATENT DOCUMENTS

| | | | |
|---|---|---|---|
| 3,306,338 A | | 2/1967 | Wright et al. |
| 3,416,870 A | * | 12/1968 | Wright .................. F23C 99/001 |
| | | | 204/168 |
| 3,749,545 A | | 7/1973 | Velkoff |
| 3,841,824 A | | 10/1974 | Bethel |
| 4,020,388 A | | 4/1977 | Pratt, Jr. |
| 4,052,139 A | * | 10/1977 | Paillaud ................... B01J 19/12 |
| | | | 123/1 A |
| 4,091,779 A | | 5/1978 | Saufferer et al. |
| 4,111,636 A | | 9/1978 | Goldberg |
| 4,340,024 A | | 7/1982 | Suzuki et al. |
| 4,439,980 A | * | 4/1984 | Biblarz ..................... B05B 5/08 |
| | | | 239/690 |
| 5,515,681 A | | 5/1996 | DeFreitas |
| 5,784,889 A | | 7/1998 | Joos et al. |
| 6,247,921 B1 | | 6/2001 | Helt |
| 7,137,808 B2 | | 11/2006 | Branston et al. |
| 7,243,496 B2 | | 7/2007 | Pavlik et al. |
| 8,082,725 B2 | | 12/2011 | Younsi et al. |
| 8,851,882 B2 | | 10/2014 | Hartwick et al. |
| 8,881,535 B2 | | 11/2014 | Hartwick et al. |
| 8,911,699 B2 | | 12/2014 | Colannino et al. |
| 9,267,680 B2 | | 2/2016 | Goodson et al. |
| 9,284,886 B2 | | 3/2016 | Breidenthal et al. |
| 9,289,780 B2 | | 3/2016 | Goodson |
| 9,310,077 B2 | | 4/2016 | Breidenthal et al. |
| 9,366,427 B2 | | 6/2016 | Sonnichsen et al. |
| 9,371,994 B2 | | 6/2016 | Goodson et al. |
| 9,377,188 B2 | | 6/2016 | Ruiz et al. |
| 9,377,189 B2 | | 6/2016 | Ruiz et al. |
| 9,377,195 B2 | | 6/2016 | Goodson et al. |
| 9,441,834 B2 | | 9/2016 | Colannino et al. |
| 9,453,640 B2 | | 9/2016 | Krichtafovitch et al. |
| 9,469,819 B2 | | 10/2016 | Wiklof |
| 9,494,317 B2 | | 11/2016 | Krichtafovitch et al. |
| 9,496,688 B2 | | 11/2016 | Krichtafovitch et al. |
| 2004/0093864 A1 | | 5/2004 | Bassett |
| 2005/0208442 A1 | | 9/2005 | Heiligers et al. |
| 2005/0208446 A1 | | 9/2005 | Jayne |
| 2007/0020567 A1 | | 1/2007 | Branston et al. |
| 2011/0036309 A1 | | 2/2011 | McAlister |
| 2011/0072786 A1 | | 3/2011 | Tokuda et al. |
| 2011/0203771 A1 | | 8/2011 | Goodson et al. |
| 2012/0023950 A1 | | 2/2012 | Weeks et al. |
| 2013/0004902 A1 | | 1/2013 | Goodson et al. |
| 2013/0071794 A1 | | 3/2013 | Colannino et al. |
| 2013/0170090 A1 | | 7/2013 | Colannino et al. |
| 2013/0230810 A1 | | 9/2013 | Goodson et al. |
| 2013/0260321 A1 | | 10/2013 | Colannino et al. |
| 2013/0323661 A1 | | 12/2013 | Goodson et al. |
| 2013/0333279 A1 | | 12/2013 | Osler et al. |
| 2013/0336352 A1 | | 12/2013 | Colannino et al. |
| 2014/0051030 A1 | | 2/2014 | Colannino et al. |
| 2014/0065558 A1 | | 3/2014 | Colannino et al. |
| 2014/0076212 A1 | | 3/2014 | Goodson et al. |
| 2014/0080070 A1 | | 3/2014 | Krichtafovitch et al. |
| 2014/0162195 A1 | | 6/2014 | Lee et al. |
| 2014/0162196 A1 | * | 6/2014 | Krichtafovitch ....... F23C 99/001 |
| | | | 431/2 |
| 2014/0162197 A1 | | 6/2014 | Krichtafovitch et al. |
| 2014/0162198 A1 | | 6/2014 | Krichtafovitch et al. |
| 2014/0170569 A1 | | 6/2014 | Anderson et al. |
| 2014/0170571 A1 | | 6/2014 | Casasanta, III et al. |
| 2014/0170575 A1 | | 6/2014 | Krichtafovitch |
| 2014/0170576 A1 | | 6/2014 | Colannino et al. |
| 2014/0170577 A1 | | 6/2014 | Colannino et al. |
| 2014/0196368 A1 | * | 7/2014 | Wiklof ..................... C10J 3/725 |
| | | | 48/89 |
| 2014/0208758 A1 | | 7/2014 | Breidenthal et al. |
| 2014/0212820 A1 | | 7/2014 | Colannino et al. |
| 2014/0216401 A1 | | 8/2014 | Colannino et al. |
| 2014/0227645 A1 | | 8/2014 | Krichtafovitch et al. |
| 2014/0227646 A1 | | 8/2014 | Krichtafovitch et al. |
| 2014/0227649 A1 | | 8/2014 | Krichtafovitch et al. |
| 2014/0248566 A1 | | 9/2014 | Krichtafovitch et al. |
| 2014/0255855 A1 | | 9/2014 | Krichtafovitch |
| 2014/0255856 A1 | | 9/2014 | Colannino et al. |
| 2014/0272731 A1 | | 9/2014 | Breidenthal et al. |
| 2014/0287368 A1 | | 9/2014 | Krichtafovitch et al. |
| 2014/0295094 A1 | | 10/2014 | Casasanta, III |
| 2014/0295360 A1 | | 10/2014 | Wiklof |
| 2014/0335460 A1 | | 11/2014 | Wiklof et al. |
| 2015/0079524 A1 | | 3/2015 | Colannino et al. |
| 2015/0107260 A1 | * | 4/2015 | Colannino ................. F23R 3/28 |
| | | | 60/776 |
| 2015/0118629 A1 | | 4/2015 | Colannino et al. |
| 2015/0121890 A1 | | 5/2015 | Colannino et al. |
| 2015/0140498 A1 | | 5/2015 | Colannino |
| 2015/0147704 A1 | | 5/2015 | Krichtafovitch et al. |
| 2015/0147705 A1 | | 5/2015 | Colannino et al. |
| 2015/0147706 A1 | | 5/2015 | Krichtafovitch et al. |
| 2015/0219333 A1 | | 8/2015 | Colannino et al. |
| 2015/0276211 A1 | | 10/2015 | Colannino et al. |
| 2015/0338089 A1 | | 11/2015 | Krichtafovitch et al. |
| 2015/0345780 A1 | | 12/2015 | Krichtafovitch |
| 2015/0345781 A1 | * | 12/2015 | Krichtafovitch .......... F23N 5/00 |
| | | | 431/2 |
| 2015/0362178 A1 | | 12/2015 | Karkow et al. |
| 2016/0018103 A1 | | 1/2016 | Karkow et al. |
| 2016/0033125 A1 | | 2/2016 | Krichtafovitch et al. |
| 2016/0040872 A1 | | 2/2016 | Colannino et al. |
| 2016/0091200 A1 | | 3/2016 | Colannino et al. |
| 2016/0123576 A1 | | 5/2016 | Colannino et al. |
| 2016/0161115 A1 | | 6/2016 | Krichtafovitch et al. |
| 2016/0245507 A1 | | 8/2016 | Goodson et al. |

FOREIGN PATENT DOCUMENTS

| | | |
|---|---|---|
| JP | 60-216111 | 10/1985 |
| JP | 60-2166111 | 10/1985 |
| WO | WO 2013/101488 | 7/2013 |

\* cited by examiner

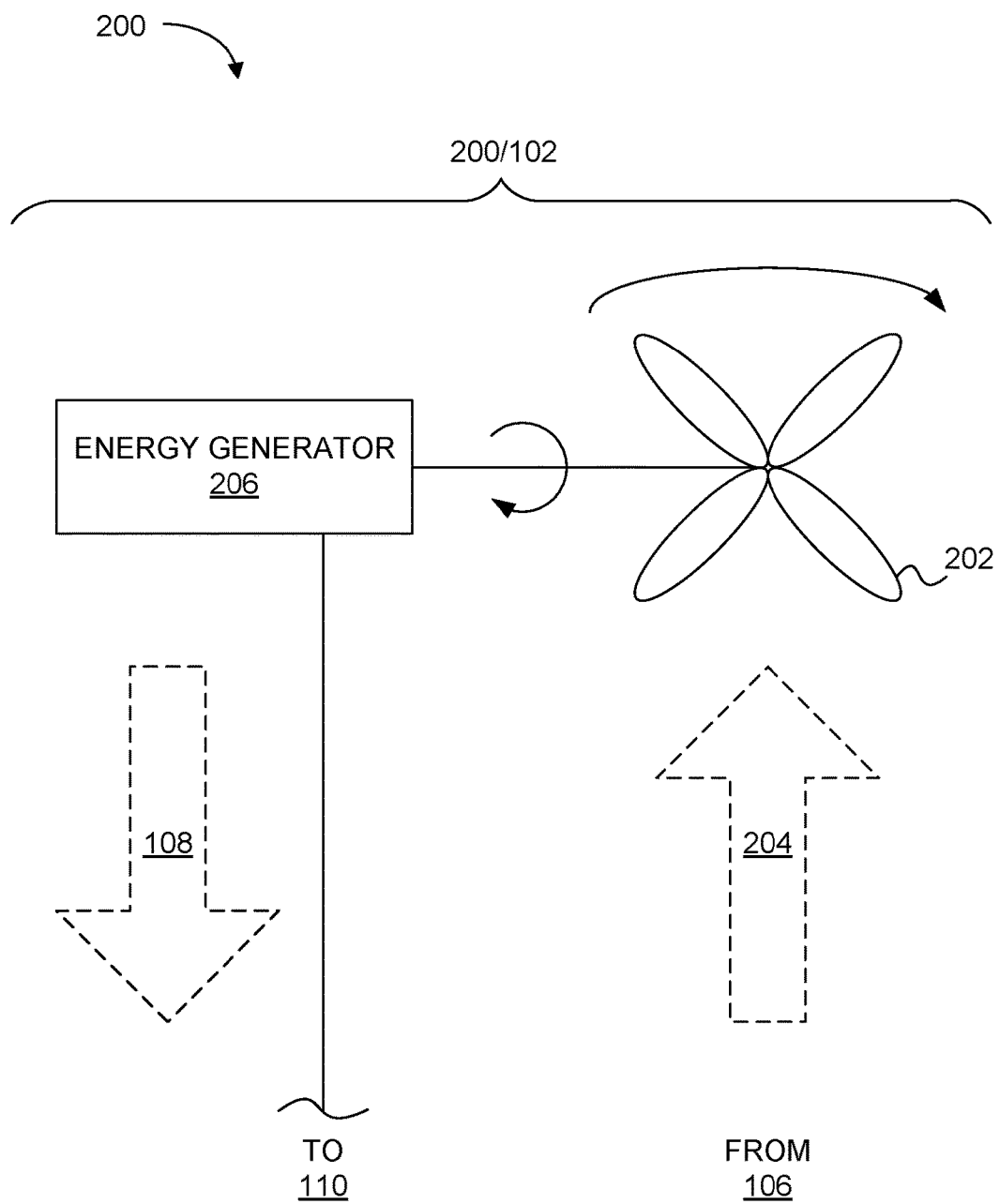

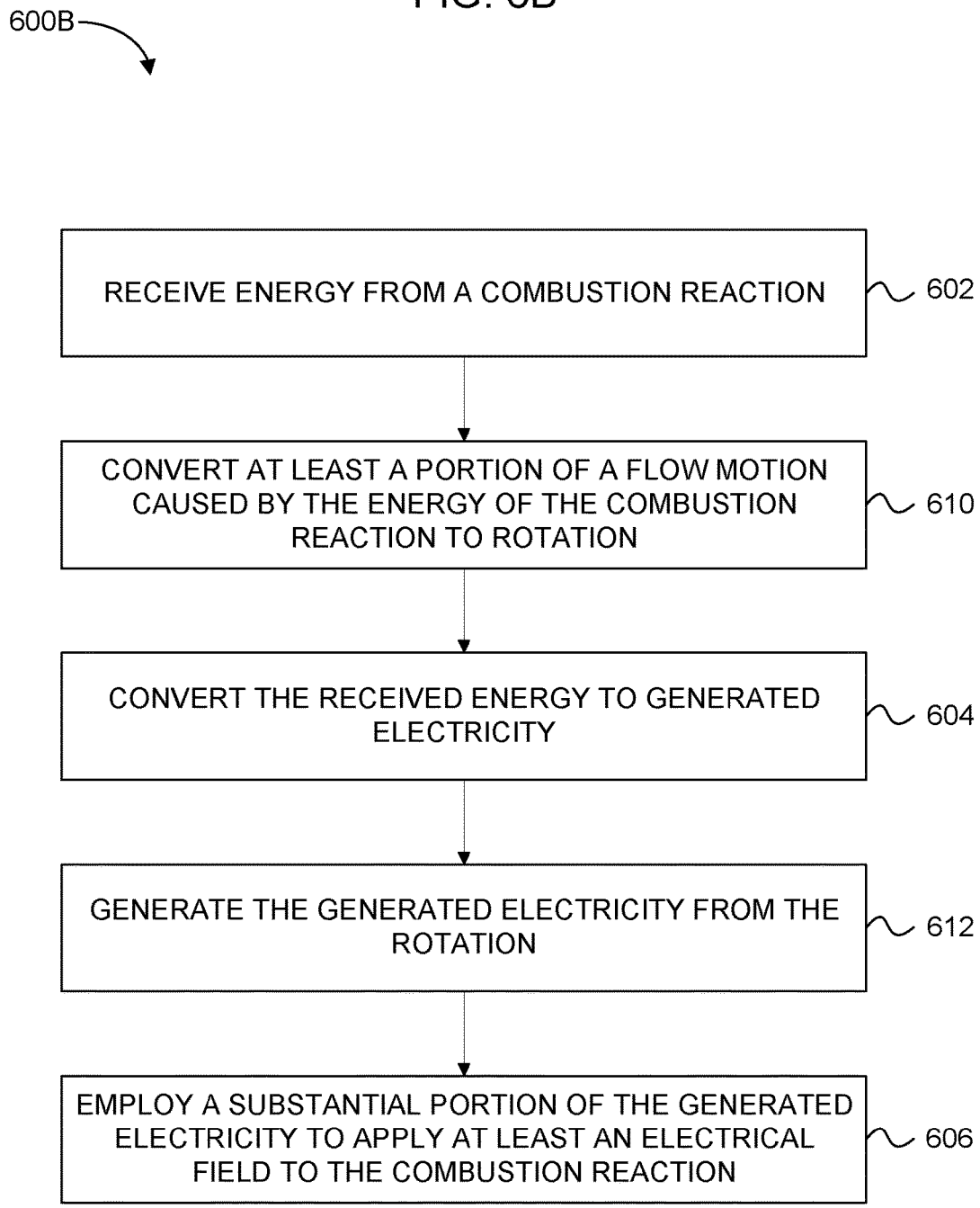

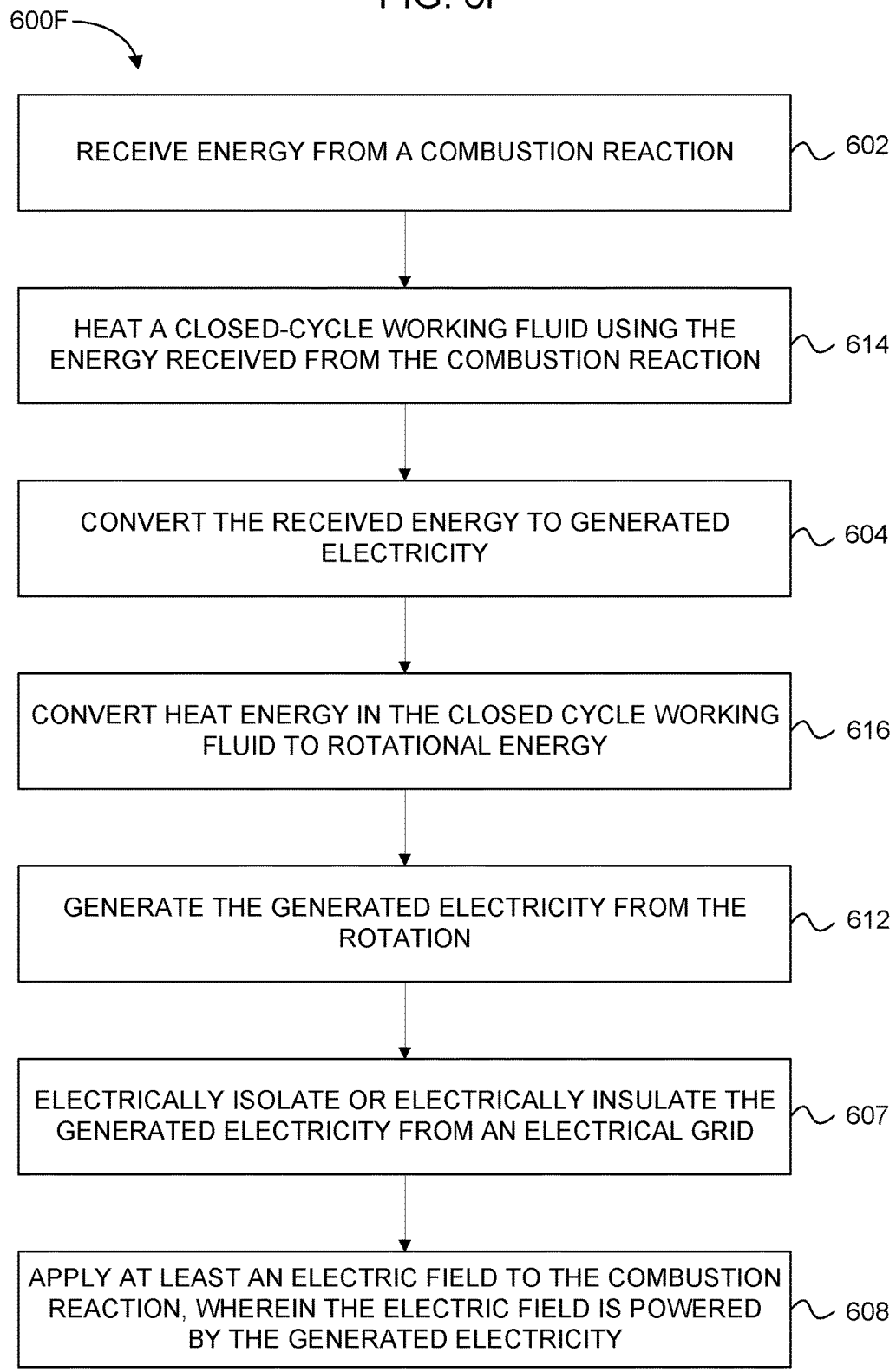

COMBUSTION-POWERED ELECTRODYNAMIC COMBUSTION SYSTEM

CROSS REFERENCE TO RELATED APPLICATIONS

The present application is a U.S. National Phase application under 35 U.S.C. §371 of co-pending International Patent Application No. PCT/US2014/045795 entitled "COMBUSTION-POWERED ELECTRODYNAMIC COMBUSTION SYSTEM," filed Jul. 8, 2014, co-pending herewith; which claims priority benefit from U.S. Provisional Patent Application No. 61/859,560, entitled "COMBUSTION-POWERED ELECTRODYNAMIC COMBUSTION SYSTEM," filed Jul. 29, 2013; each of which, to the extent not inconsistent with the disclosure herein, is incorporated by reference.

SUMMARY

In an embodiment, a combustion system includes an electrical system for applying electricity to a combustion reaction. The combustion system includes an energy converter configured to receive thermal energy from the combustion reaction and convert received thermal energy to generated electricity. The energy converter can output the generated electricity to the electrical system. The electrical system is configured to output electrical energy to the combustion reaction. The energy converter can be configured as the primary source of electricity supplied to the electrical system. Alternatively, the energy can act as a back-up power source configured to provide electricity supplied to the electrical system in the event of a power failure from external circuits and/or the electric grid.

In an embodiment, a system is provided for applying electricity to a combustion reaction. The system may include an energy converter. The energy converter is configured to receive energy from a combustion reaction and to output the received energy as generated electricity. The system may include, for example, an electrodynamic system operatively coupled to receive the generated electricity from the energy converter and to output electrical energy to the combustion reaction. At least a portion of the electrodynamic system is configured to be powered by the generated electricity from the energy converter. The generated electricity may be electrically isolated or insulated from the electrical grid.

In an embodiment, a method is provided for employing electricity to control a combustion reaction. The method may include receiving energy from a combustion reaction. The method may include converting the received energy to generated electricity. The method may include employing a substantial portion of the generated electricity to apply at least an electrical field to the combustion reaction.

In an embodiment, a method may be provided for employing electricity to control a combustion reaction. The method may include receiving energy from a combustion reaction. The method may include converting the received energy to generated electricity. The method may include electrically isolating or insulating the generated electricity from the electrical grid. The method may include applying an electric field to the combustion reaction, wherein the electric field is powered by the generated electricity.

BRIEF DESCRIPTION OF THE DRAWINGS

FIG. 2 is a conceptual diagram of an energy converter including a turbine rotor, according to an embodiment.

FIG. 6B is a flow diagram of a method for applying electrical energy to a combustion reaction, according to an embodiment.

FIG. 6F is a flow diagram of a method for applying electrical energy to a combustion reaction, according to an embodiment.

DETAILED DESCRIPTION

Figure 1:
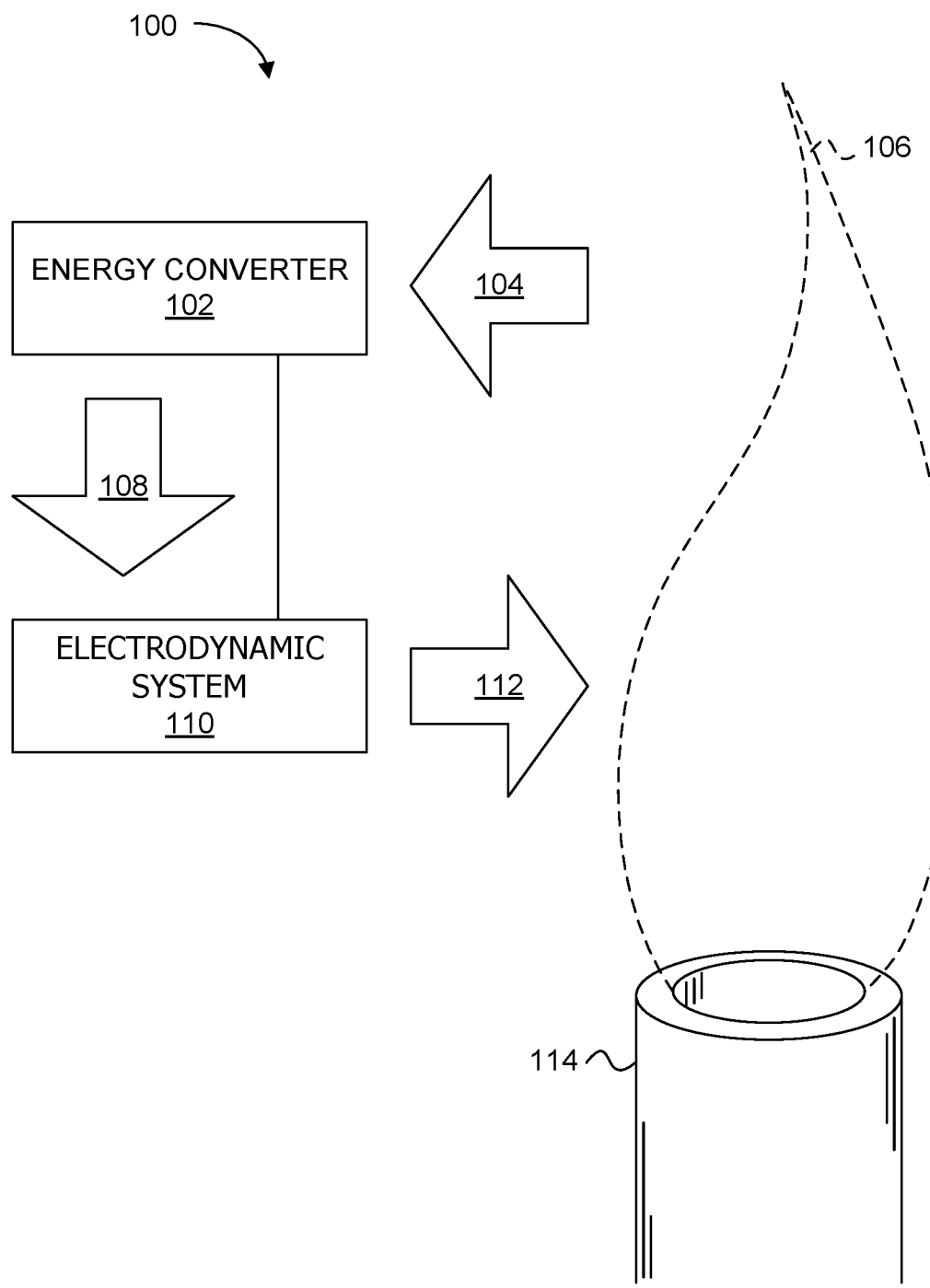
FIG. 1 is a conceptual diagram of a system for applying electrical energy to a combustion reaction, according to an embodiment.

In the following detailed description, reference is made to the accompanying drawings, which form a part hereof. In the drawings, similar symbols typically identify similar components, unless context dictates otherwise. Other embodiments may be used and/or other changes may be made without departing from the spirit or scope of the disclosure.

Combustion reactions, such as, e.g., flames, are employed in many industrial, commercial, and residential systems and processes. To name a few examples, combustion reactions are used in smelters, refineries, concrete manufacturing plants, electrical generators, waste incinerators, steam engines, commercial and residential heating and cooling plants, refrigeration systems, ovens, etc. Systems that employ a combustion reaction to perform useful work are referred to generically hereafter as combustion systems. The principles disclosed with respect to the embodiments described herein may be used advantageously in most types of combustion systems, including the examples listed above.

The inventors are unaware of any currently known combustion system that achieves more than about 60% efficiency, with most systems achieving less than about 25% efficiency. This includes energy that is reclaimed in auxiliary processes, such as turbines, secondary boilers, etc., that are used to augment the work output or otherwise improve system efficiency. This means that of the total energy released by the combustion reaction in most systems, less than half of the energy is captured for beneficial use. The remaining energy, referred to hereafter as waste energy, is lost, mostly in the form of waste heat, radiation in the visible spectrum, and kinetic energy imparted to exhaust gas.

As used in the claims, waste energy refers to energy released by a combustion reaction of a combustion system that is not captured for beneficial use within the combustion system itself or for performing the work for which the particular combustion system is configured.

FIG. 1 is a conceptual diagram of a combustion control system 100 for applying electrical energy to a combustion reaction 106 of an associated combustion system, according to an embodiment.

According to various embodiments, the system 100 for applying electrical energy to the combustion reaction 106 includes an energy converter 102 configured to receive energy 104 from a combustion reaction 106 and output the received energy 104 as generated electricity 108. An electrodynamic system 110 is operatively coupled to receive the generated electricity 108 from the energy converter 102. The electrodynamic system 110 may be configured, for example, to output an electric field 112 to the combustion reaction 106, an electric potential, or otherwise apply electrical energy to the combustion reaction 106. At least a portion of the electrodynamic system 110 is configured to be powered by the generated electricity 108 from the energy converter 102.

The term generated electricity is used hereafter to refer specifically to electricity produced by a device such as the energy converter 108 or equivalent device.

According to some embodiments, the electrodynamic system 110 is configured to apply electrical energy to a plurality of combustion reactions. According to other embodiments, the energy converter 102 is configured to output the generated electricity 108 to a plurality of electrodynamic systems, each configured to apply electrical energy to a respective one or more combustion reactions. Reference hereafter and in the claims to the energy converter 102, the electrodynamic system 110, and/or the combustion reaction 106 includes within its scope, as appropriate, a single energy converter in combination with a plurality of electrodynamic systems, and/or one or more electrodynamic systems associated with a plurality of combustion reactions.

According to various embodiments, the energy converter 102 is a dedicated device configured to provide power for the electrodynamic system 110, and is configured to output a substantial portion of the generated electricity 108 to the electrodynamic combustion system 110.

As used herein, the term dedicated, used with reference to an energy converter, refers to an energy converter whose output of generated electricity is transmitted, as a first priority, to an electrodynamic system, during at least a part of the time spent in normal operation of the associated combustion system. In other words, while a dedicated energy converter may at times produce more generated electricity than is required by the associated electrodynamic system, in which case, surplus electricity may be used for other purposes, none of the generated electricity is diverted for use elsewhere unless and until the associated electrodynamic system is fully powered by generated electricity from the energy converter.

For example, according to an embodiment, a dedicated energy converter is provided from which at least 1% of the generated electricity is output to an electrodynamic system during at least a part of the time spent in normal operation of the associated combustion system.

It will be recognized that many combustion systems are configured to operate within a range of output levels during normal operation, meaning that the level of energy received by the energy converter 102 may vary widely during normal operation of the combustion system.

According to some embodiments, the energy converter 102 is configured to produce sufficient generated electricity 108 to power the electrodynamic system 110 even when the combustion reaction 106 is operating at a low end of the range of output levels. Of course, when the combustion reaction 106 is operating at a high end of the range of output levels, the received energy 104 will be much greater, so the energy converter 102 may produce much more generated electricity 108 than is required for operation of the electrodynamic system 110. Thus, according to various embodiments, even though the energy converter 102 is a dedicated device, it is configured to divert a portion of the generated electricity 108 not used within the combustion control system 100 to external systems, local power grids, municipal power grids, etc.

According to one embodiment, the energy converter 102 is configured to output at least half of the generated electricity 108 to the electrodynamic combustion system 110 while an associated combustion system is operating within some part of a range of output levels during normal operation. According to another embodiment, the energy converter 102 is configured to output at least 25% of the generated electricity 108 to the electrodynamic combustion system 110. According to a further embodiment, the energy converter 102 is configured to output at least 10% of the generated electricity 108 to the electrodynamic combustion system 110. According to another embodiment, the energy converter 102 is configured to output at least 1% of the generated electricity 108 to the electrodynamic combustion system 110. According to various embodiments, the energy converter 102 may also be configured to output as much as 100%, or substantially all of the generated electricity 108 to the electrodynamic combustion system 110 during some or all of the normal operation of an associated combustion system.

According to various embodiments, the energy converter 102 is regulated to produce only sufficient generated electricity 108 to power the electrodynamic combustion system 110, regardless of the output level of the combustion reaction 106. Thus, according to an embodiment, the energy converter 102 is configured to output at least half of the generated electricity 108 to the electrodynamic combustion system 110. According to another embodiment, the energy converter 102 is configured to output at least 75% of the generated electricity 108 to the electrodynamic combustion system 110, And according to a further embodiment, the energy converter 102 is configured to output at least 90% of the generated electricity 108 to the electrodynamic combustion system 110.

Additionally or alternatively, the energy converter 102 may be configured to output the generated electricity 108 exclusively to the electrodynamic combustion system 110.

According to an embodiment, the generated electricity 108 is electrically isolated or electrically insulated from a wall current or an electrical grid.

According to an embodiment, the generated electricity 108 is outputted directly from the energy converter 102 to the electrodynamic combustion system 110, meaning that the generated electricity 108 is outputted to the electrodynamic combustion system 110 without being first to devices or systems external to the associated combustion system.

According to various embodiments, the energy converter 102 is configured to produce at least sufficient generated electricity 108 to power the electrodynamic system 110 while the associated combustion system is operating at an output level near an average output level of the system. When the energy converter 102 produces more generated electricity 108 than is required for operation of the electrodynamic system 110, such as while the combustion reaction 106 is operating at an output level that is higher than average, excess generated electricity 108 is saved in an energy storage device, including batteries, capacitors, or the like. Conversely, when the energy converter 102 produces less generated electricity 108 than is required for operation of the electrodynamic system 110, such as while the combustion reaction 106 is operating at an output level that is lower than average, electrical energy sufficient to make up the deficiency is drawn from the energy storage device.

According to some embodiments, the combustion control system 100 is configured to draw power from an external source during start-up of the associated combustion system, while the received energy 104 is not at a normal operating level. This may be the case even in some embodiments in which the electrodynamic system 110 is otherwise independent of external power. According to other embodiments, the combustion control system 100 is configured to draw power from a storage device during start-up of the associated combustion system. According to one embodiment, a charge is maintained in the storage device from excess generated electricity 108, as described above. According to another embodiment, the storage device is charged externally to the combustion control system 100.

According to various embodiments, the energy converter 102 is positioned and configured, with respect to the combustion reaction 106, to receive a portion of the waste energy from the combustion reaction 106, and configured to generate sufficient electrical energy, during normal operation of the associated combustion system, to power the electrodynamic system 110 while having negligible impact on the amount or percentage of the total received energy 104 captured by the associated combustion system for beneficial use.

FIG. 2 is a conceptual diagram of an energy converter 102 including a turbine rotor 202, according to an embodiment.

According to various embodiments, the energy converter 102 may include the turbine rotor 202 configured to convert at least a portion of a flow 204 caused by the energy 104 of the combustion reaction 106 to rotation. An electrical generator 206 is configured to produce the generated electricity 108 from the rotation.

According to various embodiments, the flow 204 may include any of a number of fluids, including, for example, a fuel, an oxidant, a combustion reaction product, a flue gas, a carrier gas, steam, air, or a combination of one or more vapors or gases.

According to various embodiments, the flow 204 includes a gas flow of the combustion reaction 106. The energy converter 102 includes a closed-cycle heat engine. The closed-cycle heat engine is configured to convert heating of a working fluid by the energy 104 from the combustion reaction 106 to rotation. The electrical generator 206 configured to produce the generated electricity 108 from the rotation provided by the closed-cycle heat engine.

According to various embodiments, the closed-cycle heat engine may include a steam engine. Additionally or alternatively, the closed-cycle heat engine may include a Stirling cycle engine. The closed-cycle heat engine may include a Brayton cycle engine. The closed-cycle heat engine may include an Ericsson cycle engine. The closed-cycle heat engine may include a Kalina cycle engine.

Figure 3A:
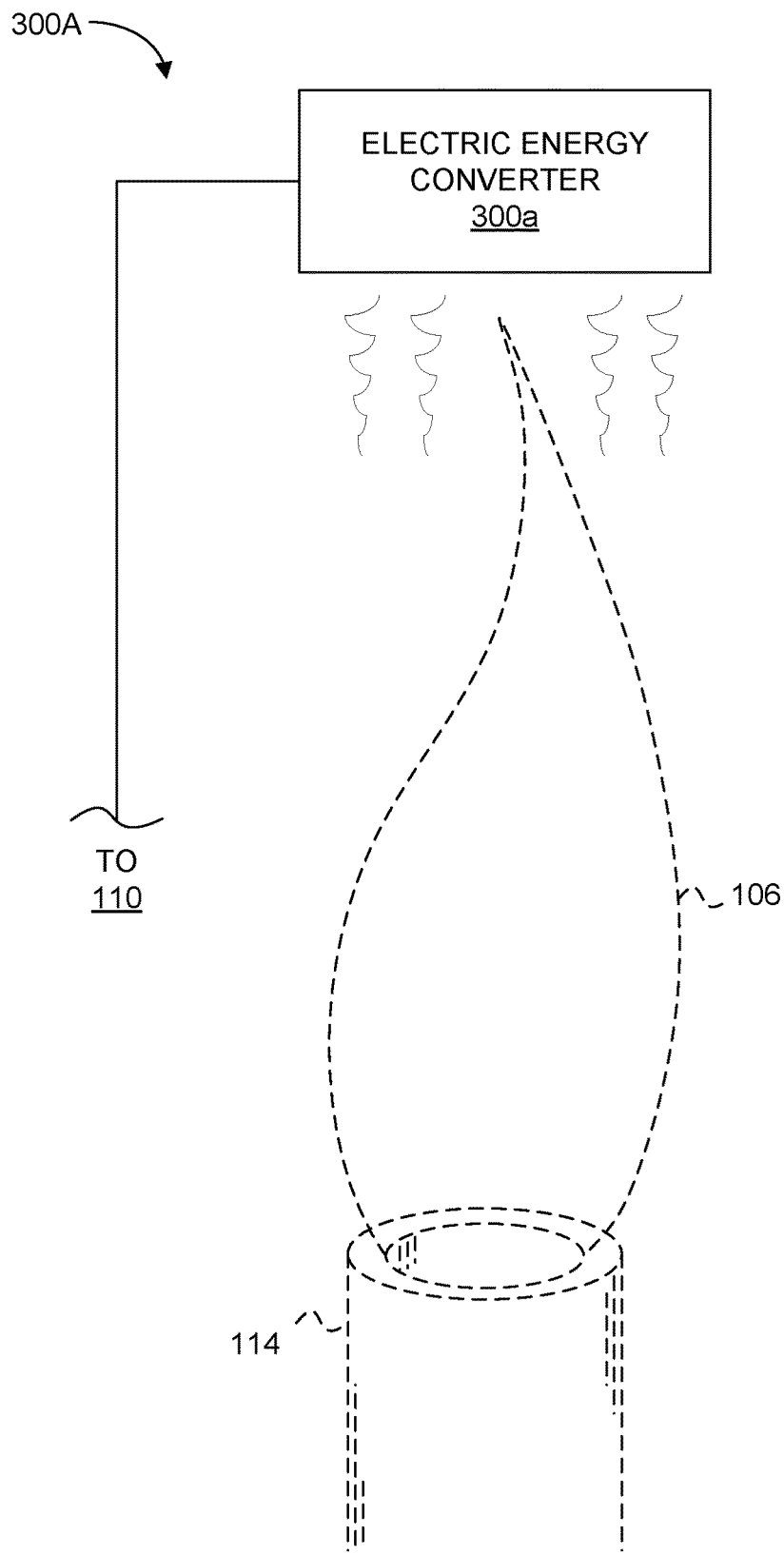
FIG. 3A is a conceptual diagram of an energy converter including a thermoelectric element, according to an embodiment.

FIG. 3A is a conceptual diagram of an energy converter 102 including a thermoelectric element, according to an embodiment.

According to various embodiments, the energy converter 102 includes an electric energy converter 300*a* configured to convert the energy 104 in the form of heat to the generated electricity 108. The electric energy converter 300*a* may include, for example, a thermoelectric element, a pyroelectric element, a thermionic converter, a photovoltaic element, or a combination of a plurality of converters.

Figure 3B:
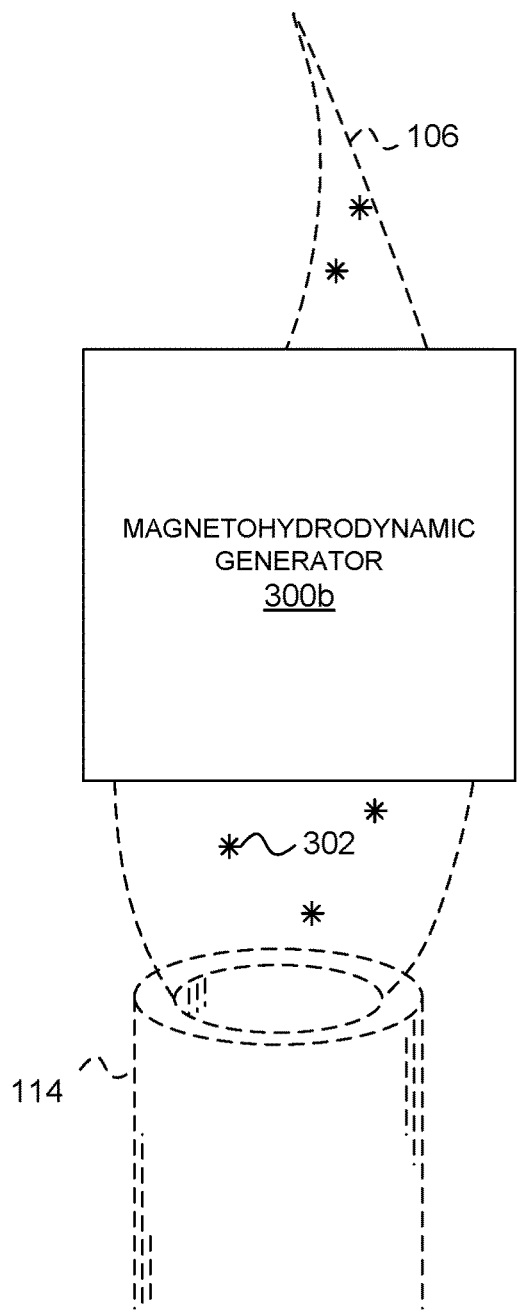
FIG. 3B is a conceptual diagram of an energy converter including a magnetohydrodynamic generator, according to an embodiment.

FIG. 3B is a conceptual diagram of the energy converter 102 including a magnetohydrodynamic generator 300*b*, according to an embodiment.

According to various embodiments, the energy converter 102 includes a magnetohydrodynamic generator 300*b*. The magnetohydrodynamic generator 300*b* is configured to produce the generated electricity 108 from the energy 104 in the form of motion of ions 302 of the combustion reaction 106. Additionally or alternatively, the energy converter 102 may be configured to produce the generated electricity 108 from the energy 104 while substantially maintaining a temperature of the combustion reaction 106.

Magnetohydrodynamic generators 300*b* may produce the generated electricity 108 without significantly affecting a temperature of the combustion reaction 106. According to an embodiment, the magnetohydrodynamic generator 300*b* may be used, for example, to produce the generated electricity 108 and at the same time to avoid decreasing the thermal output of the combustion reaction 106.

Figure 3C:
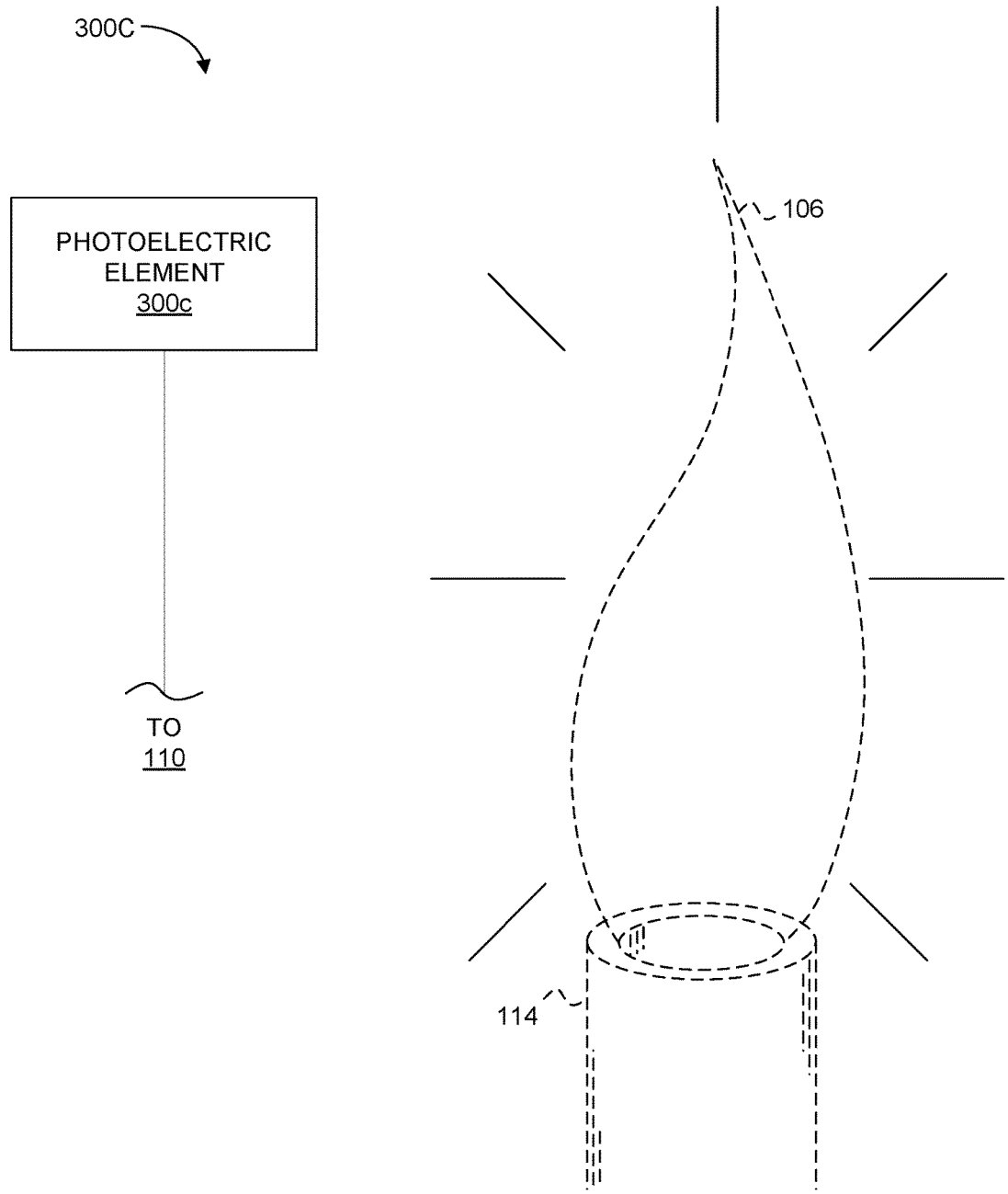
FIG. 3C is a conceptual diagram of an energy converter including a photoelectric element, according to an embodiment.

FIG. 3C is a conceptual diagram of the energy converter 102 including a photoelectric element, according to an embodiment.

According to various embodiments, the energy converter 102 includes a photoelectric element 300*c* configured to convert the energy 104 in the form of light emitted by the combustion reaction 106 to the generated electricity 108. The photoelectric element 300*c* may be configured to convert the energy 104 in the form of infrared light emitted by the combustion reaction 106 to the generated electricity 108. The energy converter 102 may be electrically insulated or isolated from ground or another voltage.

Figure 4:
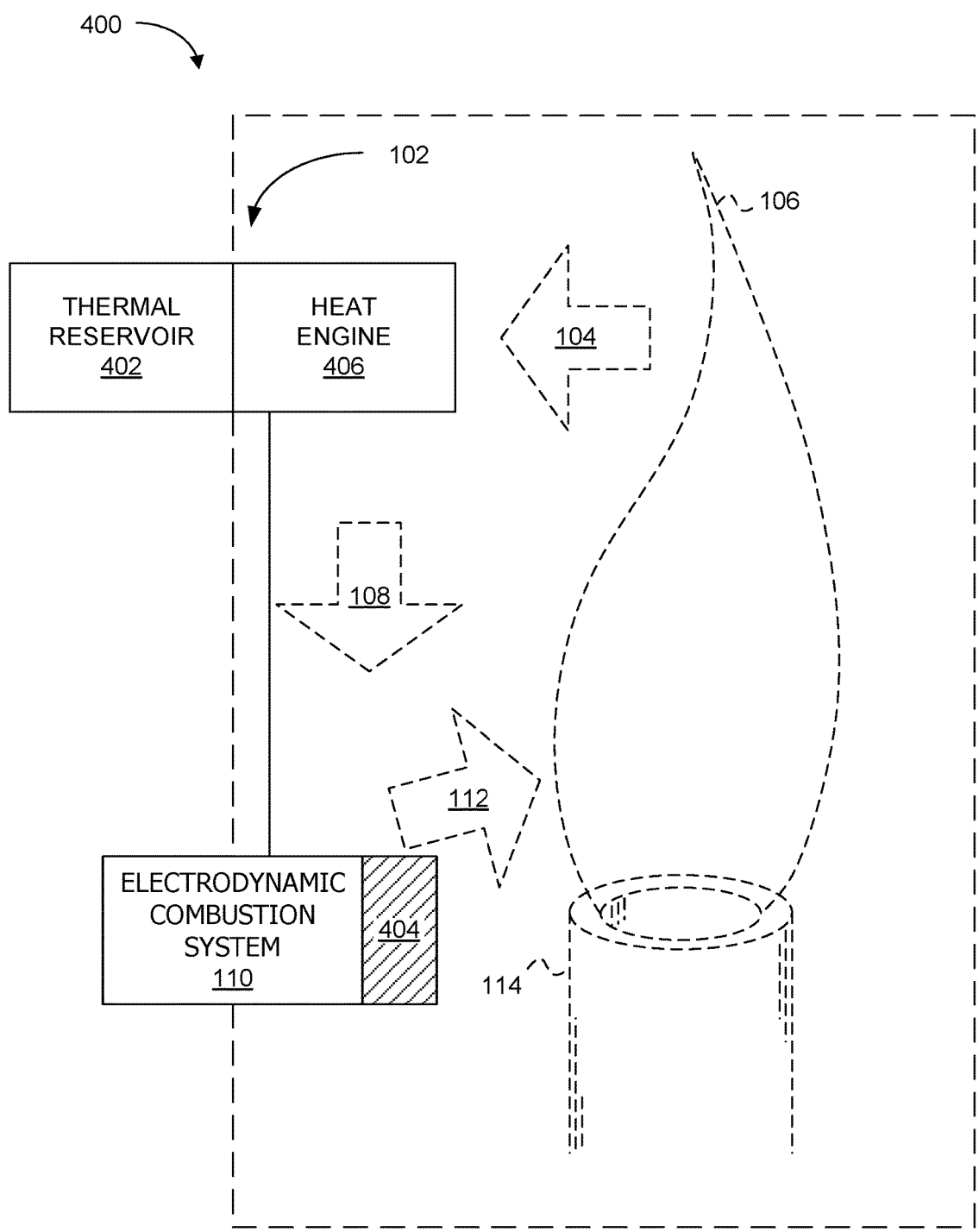
FIG. 4 is a conceptual diagram of a system for applying electrical energy to a combustion reaction, according to an embodiment.

FIG. 4 is a conceptual diagram of a system 400 for applying electrical energy 108 to a combustion reaction 106, according to an embodiment.

According to the embodiment of FIG. 4, a portion of the energy converter 102 is located inside a combustion volume 400 configured to support the combustion reaction 106. The energy converter 102 includes a heat engine 406 and a thermal reservoir 402. The thermal reservoir 402 is operatively coupled to the heat engine 406 and configured to receive thermal energy from the combustion reaction 106 via the heat engine 406.

According to various embodiments, the thermal reservoir 402 may include a heat pipe. Additionally or alternatively, the thermal reservoir 402 may include a heat sink. Additionally or alternatively, the thermal reservoir 402 may include an active cooling apparatus.

According to various embodiments, a portion of the heat engine 406 is located in the combustion volume 400 configured to support the combustion reaction 106. The thermal reservoir 402, or at least a portion thereof, is located outside of the combustion volume 400. Heat transferred to the thermal reservoir 402 by the heat engine 406 is removed from the energy converter 102 by any of a number of known means, thereby maintaining the temperature of the thermal reservoir 402 at a level that enables continued heat transfer.

According to various embodiments, a thermal protector 404 is operatively coupled to the energy converter 102 and/or the electrodynamic system 110. The thermal protector 404 is configured to protect the energy converter 102 or the electrodynamic system 110 from heat of the combustion reaction 106.

The thermal protector 404 may include an element configured to reduce or prevent the transmission of thermal energy, such as, for example, a thermal insulator, a thermal shield, a heat pipe, a heat sink, or an active cooling apparatus. The thermal protector 404 may alternatively include a combination of a plurality of such elements.

According to an embodiment, at least a portion of the electrodynamic combustion system 110 is configured to be located in the combustion volume 400 configured to support the combustion reaction 106.

According to various embodiments, the energy converter 102 and the electrodynamic system 110 may be configured to be substantially located within the combustion volume 400 configured to support the combustion reaction 106.

Figure 5A:
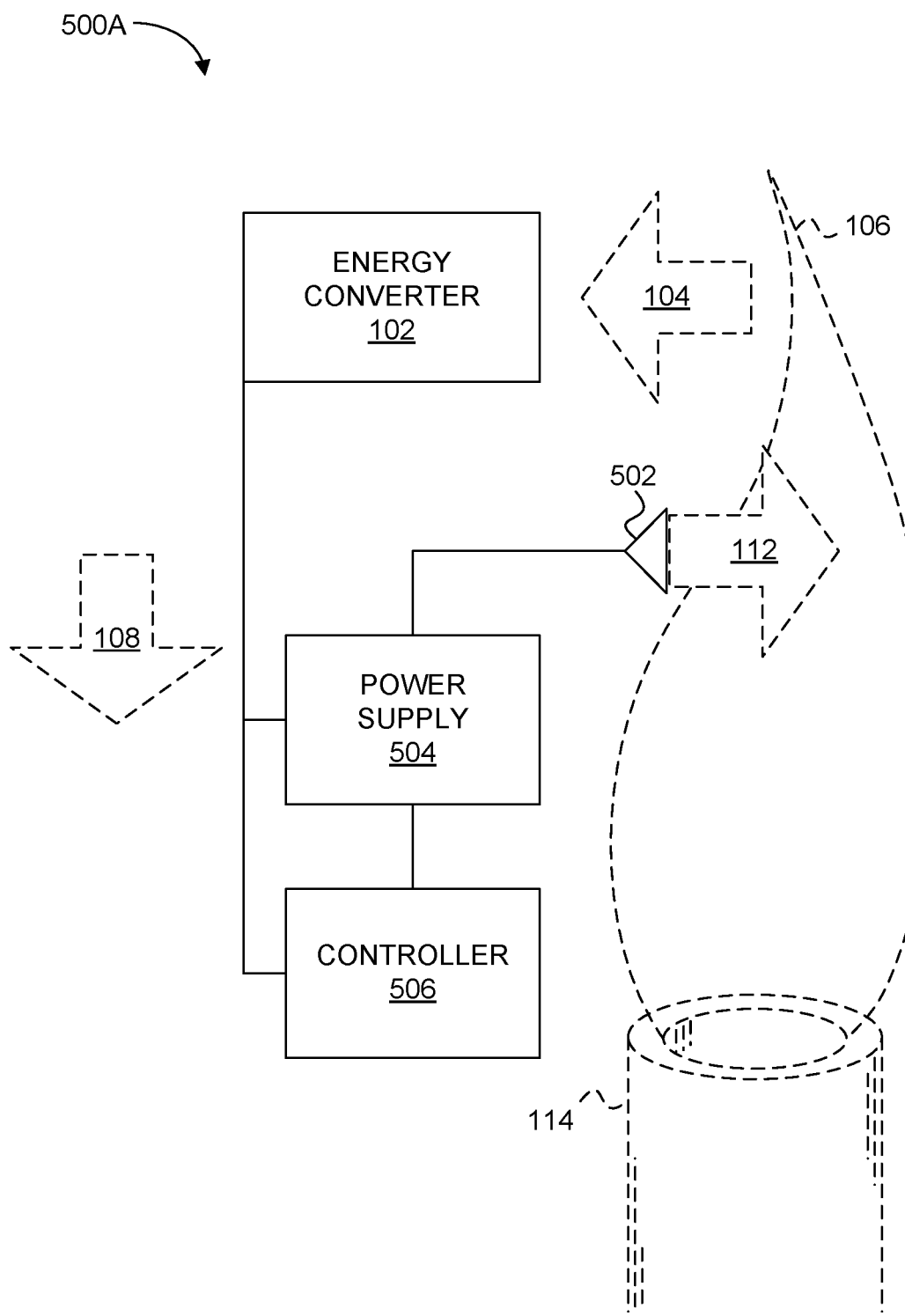
FIG. 5A is a conceptual diagram of a system for applying electrical energy to a combustion reaction including details of an electrodynamic system, according to an embodiment.

FIG. 5A is a conceptual diagram of a system 500A for applying electrical energy 108 to a combustion reaction 106 including details of an electrodynamic system, according to an embodiment.

According to various embodiments, the electrodynamic system 110 may include one or more electrodes 502 configured to apply the electric field 112 to the combustion reaction 106. A power supply 504 is powered by the generated electricity 108 and operatively coupled to the one or more electrodes 502.

According to various embodiments, a controller 506 is operatively coupled to the power supply 504. The controller 506 may be configured to control the power supply 504 to drive the one or more electrodes 502 to apply the electric field 112 to the combustion reaction 106.

Figure 5B:
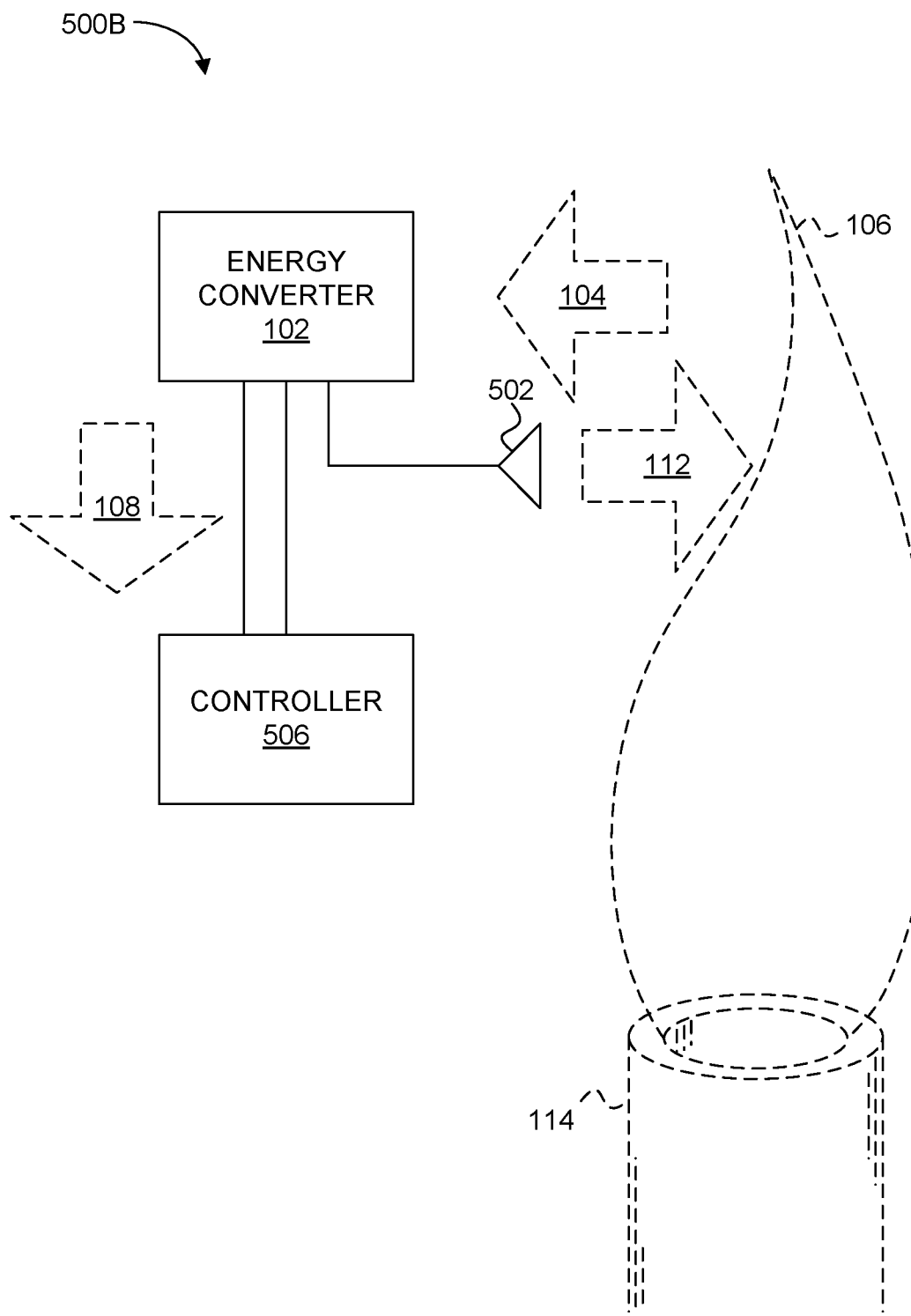
FIG. 5B is a conceptual diagram of a system for applying electrical energy to a combustion reaction including details of an electrodynamic system, according to an embodiment.
Figure 6A:
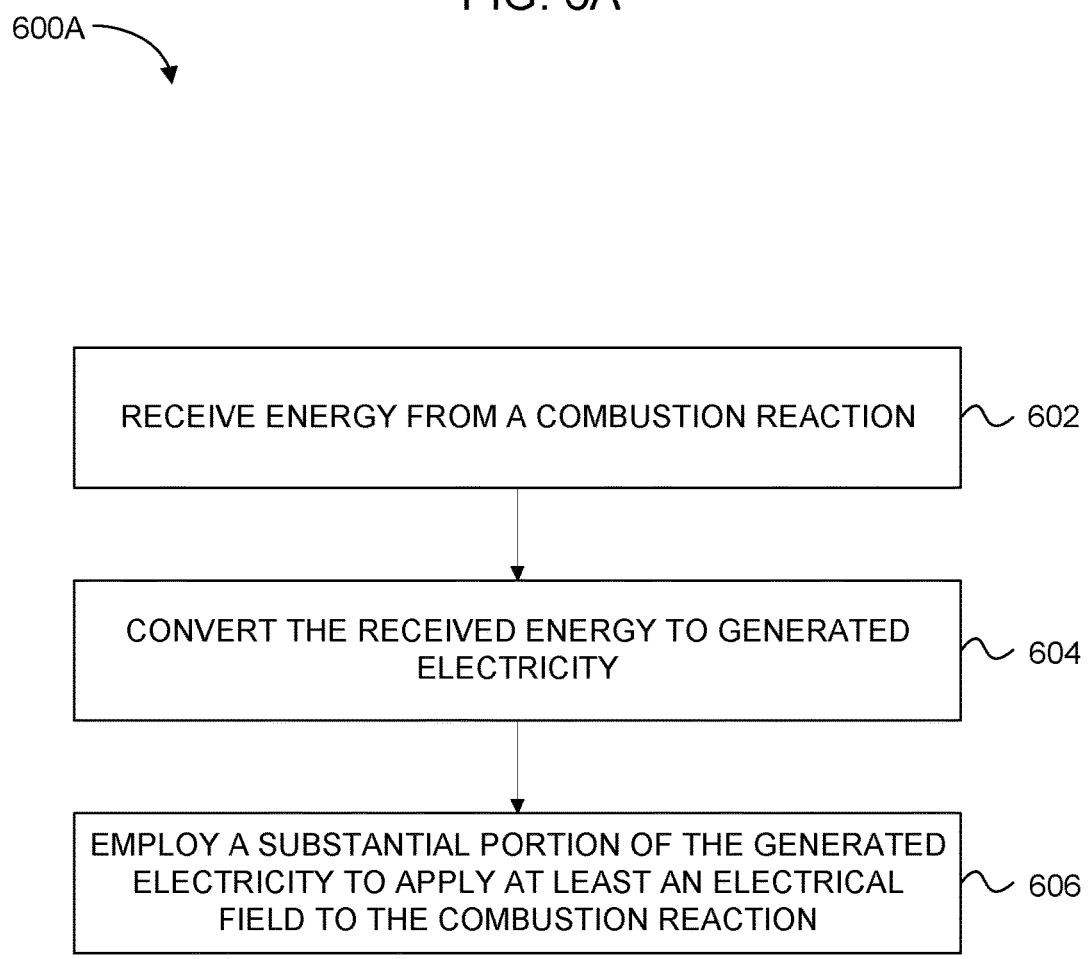
FIG. 6A is a flow diagram of a method for applying electrical energy to a combustion reaction, according to an embodiment.
Figure 6C:
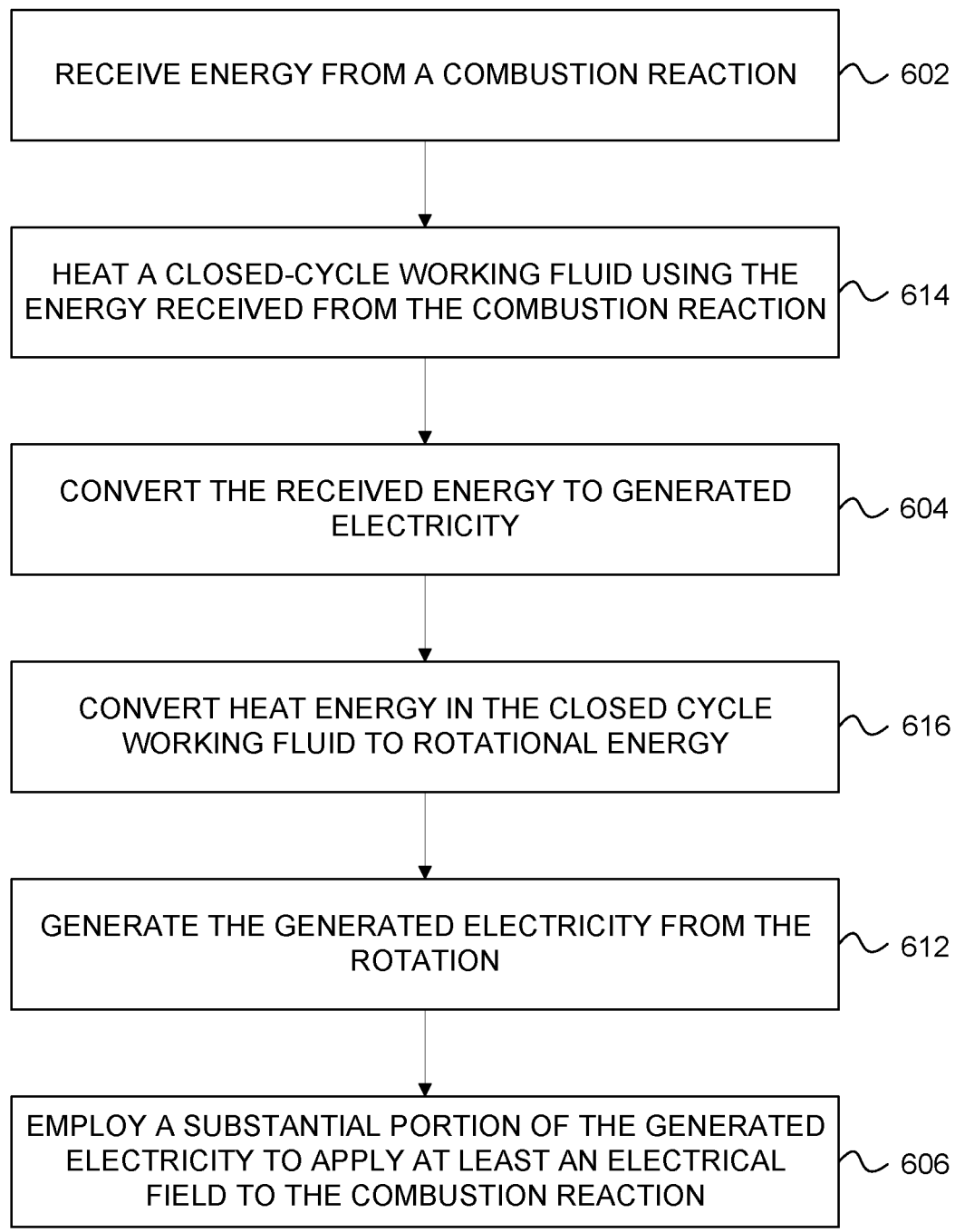
FIG. 6C is a flow diagram of a method for applying electrical energy to a combustion reaction, according to an embodiment.
Figure 6D:
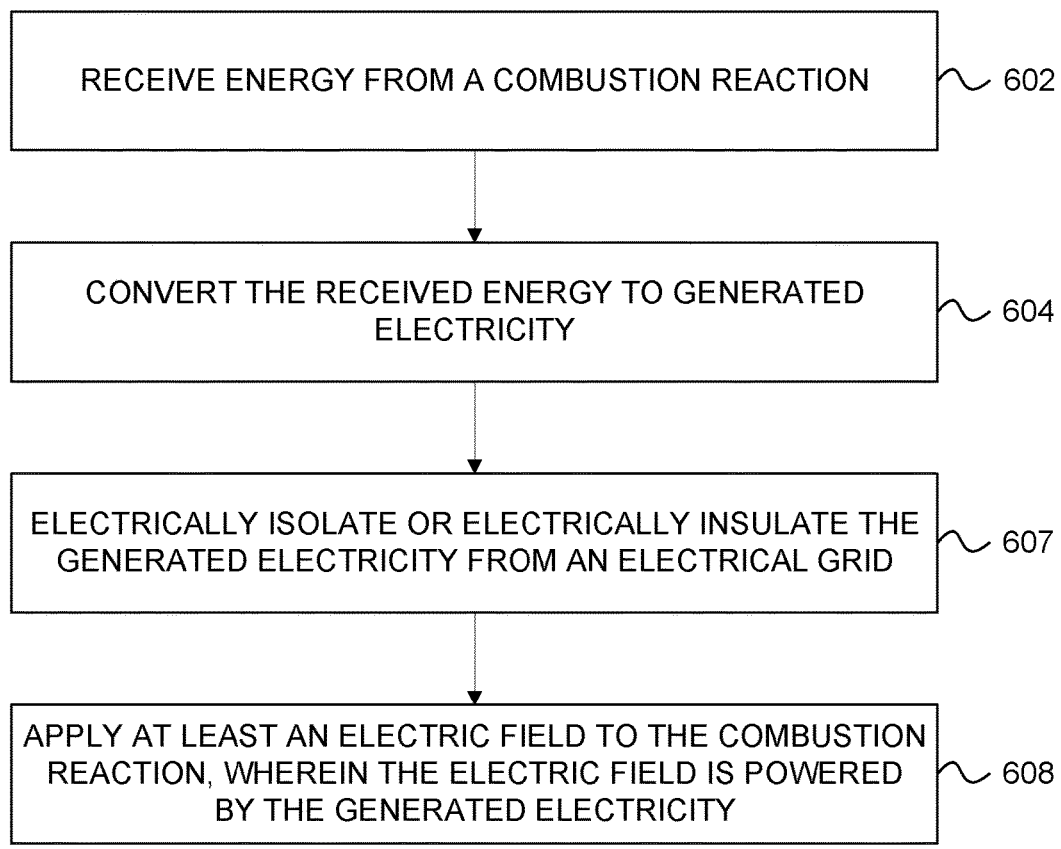
FIG. 6D is a flow diagram of a method for applying electrical energy to a combustion reaction, according to an embodiment.
Figure 6E:
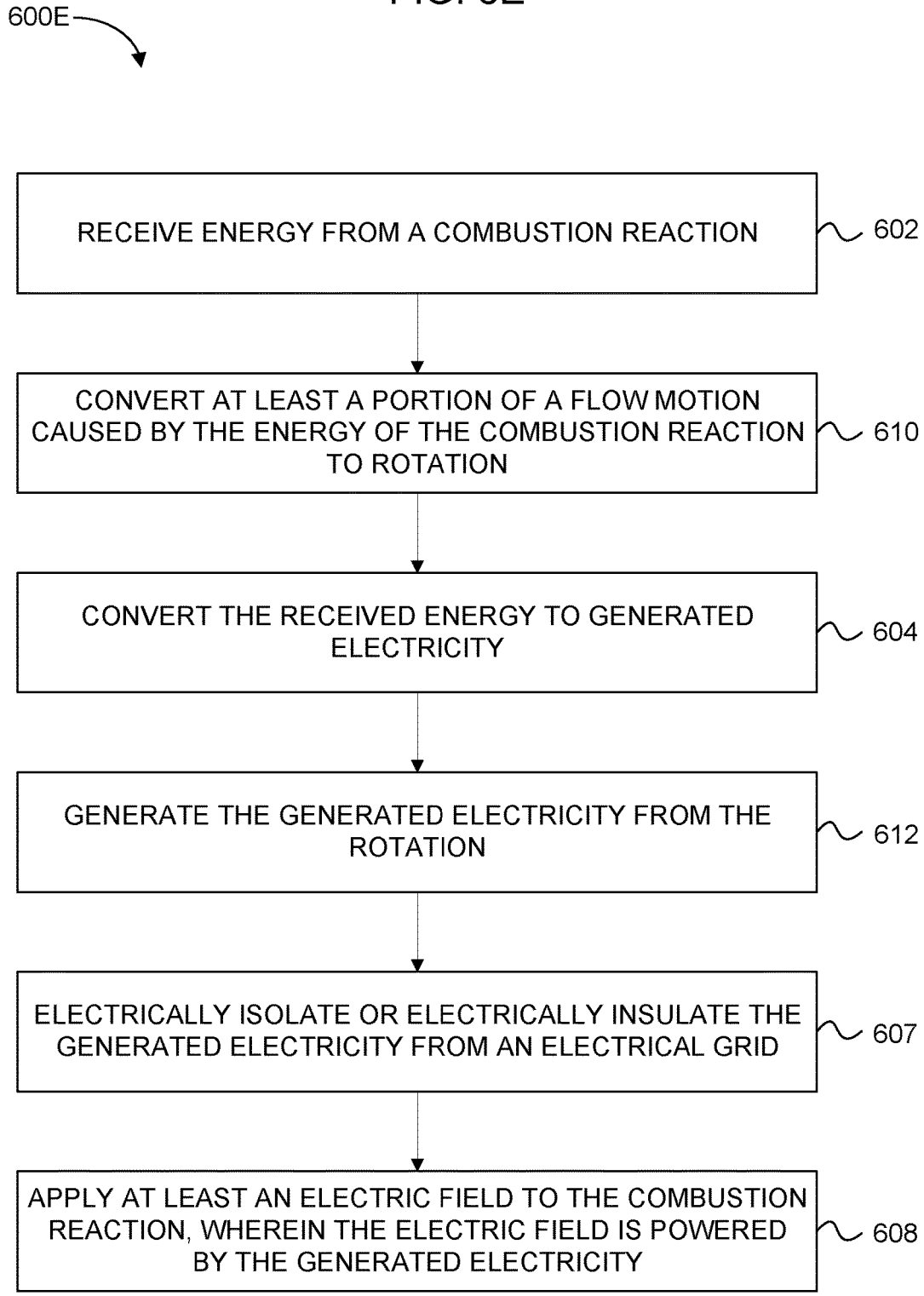
FIG. 6E is a flow diagram of a method for applying electrical energy to a combustion reaction, according to an embodiment.

FIG. 5B is a conceptual diagram of a system 500B for applying electrical energy 108 to a combustion reaction 106 including details of an electrodynamic system 110, according to an embodiment.

According to various embodiments, the electrodynamic system 110 includes one or more electrodes 502 operatively coupled to the energy converter 102. The controller 506 is operatively coupled to the energy converter 102, and configured to control the energy converter 102 to drive the one or more electrodes 502 to apply the electric field 112 to the combustion reaction 106. The electrodynamic system 110 may be electrically insulated or isolated from ground or another voltage.

According to various embodiments, the electrodynamic combustion system 110 may be configured to be exclusively powered by the generated electricity 108 from the energy converter 102. The energy converter 102 may be configured to output the generated electricity 108 as time-varying generated electricity 108. The electrodynamic system 110 may be configured to apply a voltage to the combustion reaction 106. Additionally or alternatively, the electrodynamic system 110 may be configured to apply a charge to the combustion reaction 106. The electrodynamic system 110 may be configured to apply an electric field 112 to the combustion reaction 106. The electrodynamic system 110 may be configured to apply a combination of electrical signals to the combustion reaction 106.

According to various embodiments, the electrodynamic system 110 may be configured to apply a time-varying voltage to the combustion reaction 106. Additionally or alternatively, the electrodynamic system 110 may be configured to apply a time-varying charge to the combustion reaction 106. The electrodynamic system 110 may be configured to apply at least the electric field 112 as a time-varying electric field 112 to the combustion reaction 106. The electrodynamic system 110 may be configured to apply a combination of time varying electrical signals to the combustion reaction 106.

According to various embodiments, the electrodynamic system 110 is configured to output a charge to the combustion reaction 106 to increase an electrical potential of the combustion reaction 106. Additionally or alternatively, the electrodynamic system 110 may be configured to output a charge to the combustion reaction 106 to electrically charge of the combustion reaction 106. The combustion reaction 106 may include an electrical potential. The electrodynamic system 110 may be configured to apply at least the electric field 112 to the combustion reaction 106. The electric field 112 may be selected to interact with the electrical potential to cause a measurable effect on the combustion reaction 106. A burner or fuel supply 114 may be configured to support the combustion reaction 106. The combustion reaction 106 may include a flame.

FIGS. 6A-F are flow diagrams showing various methods 600 for applying electrical energy to a combustion reaction, according to embodiments.

According to various embodiments, the methods 600A-F for employing electrical energy to control a combustion reaction may include an operation 602 receiving energy from a combustion reaction. Additionally or alternatively, the methods 600A-F for employing electrical energy to control a combustion reaction include an operation 604 converting the received energy to generated electricity. Additionally or alternatively, the methods 600A-F for employing electrical energy to control a combustion reaction may include an operation 606 employing a substantial portion of the generated electricity to apply at least an electrical field to the combustion reaction.

In an embodiment, the methods 600A-F for employing electrical energy to control a combustion reaction may include electrically isolating or insulating the generated electricity from a wall current or an electrical grid.

According to various embodiments, operation 606 employing a substantial portion of the generated electricity to apply at least an electrical field to the combustion reaction may include employing substantially an entirety of the generated electricity. Additionally or alternatively, operation 602 receiving the energy from the combustion reaction and operation 604 converting the received energy to generated electricity may include converting at least a portion of a flow motion caused by the energy of the combustion reaction to rotation and generating the generated electricity from the rotation.

According to various embodiments, the flow may include a fuel. Additionally or alternatively, the flow may include an oxidant. The flow may include a combustion reaction product. The flow may include a flue gas. The flow may include a carrier gas. The flow may include steam. The flow may include air. The flow may include a combination of one or more vapors thereof. The flow may include a gas flow of the combustion reaction. Converting at least a portion of a flow caused by the energy of the combustion reaction to rotation may include physically isolating a gas flow from the combustion reaction. Physically isolating a gas flow from the combustion reaction may include heating the isolated gas using the energy of the combustion reaction to cause the isolated gas to flow.

According to various embodiments, converting at least a portion of a flow caused by the energy of the combustion reaction to rotation may include creating at least a portion of the flow by pneumatically or hydraulically flowing a fuel to the combustion reaction. Additionally or alternatively, creating at least a portion of the flow may include pneumatically or hydraulically flowing an oxidant to the combustion reaction. Creating at least a portion of the flow may include pneumatically or hydraulically flowing a carrier gas to the combustion reaction. Creating at least a portion of the flow may include pneumatically or hydraulically flowing a combination of one or more materials to the combustion reaction. At least a portion of the energy of the combustion reaction includes a pneumatic or hydraulic contribution.

According to various embodiments, operation 602 receiving the energy from the combustion reaction and operation 604 converting the received energy to generated electricity may include heating a closed-cycle working fluid using the energy received from the combustion reaction. Heating a closed-cycle working fluid using the energy received from the combustion reaction may include converting heat energy in the closed cycle working fluid to rotational energy. Converting heat energy in the closed cycle working fluid to rotational energy may include generating the generated electricity from the rotational energy.

According to various embodiments, receiving the energy from the combustion reaction may include employing a steam cycle. Additionally or alternatively, receiving the energy from the combustion reaction may include employing a Stirling cycle. Receiving the energy from the combustion reaction may include employing a Brayton cycle. Receiving the energy from the combustion reaction may include employing an Ericsson cycle. Receiving the energy from the combustion reaction may include employing or a Kalina cycle. Receiving the energy from the combustion reaction may include employing a combination of one or more energy conversion processes thereof.

According to various embodiments, receiving the energy from the combustion reaction and converting the received energy to the generated electricity may include receiving the energy in the form of heat and thermoelectrically converting the heat to the generated electricity. Additionally or alternatively, receiving the energy from the combustion reaction and converting the received energy to the generated electricity may include receiving the energy in the form of heat and pyroelectrically converting the heat to the generated electricity. Additionally or alternatively, receiving the energy from the combustion reaction and converting the received energy to the generated electricity may include receiving the energy in the form of heat and thermoionically converting the heat to the generated electricity. Additionally or alternatively, receiving the energy from the combustion reaction and converting the received energy to the generated electricity may include magnetohydrodynamically capturing the energy as carried by a flow of ions of the combustion reaction and outputting the energy as the generated electricity.

According to an embodiment, receiving the energy from the combustion reaction and converting the received energy to the generated electricity may include receiving the energy from the combustion reaction in the form of light and photoelectrically converting the received energy to the generated electricity. The light may include infrared light.

According to various embodiments, receiving the energy from the combustion reaction may include employing a heat engine, which may include supporting the combustion reaction within the combustion volume. Employing a heat engine may include heating a first portion of the heat engine within the combustion volume and cooling a second portion of the heat engine outside the volume. Employing a heat engine may include outputting rotation from the heat engine and generating the generated electricity from the rotation.

According to various embodiments, cooling the second portion of the heat engine may include employing a heat pipe. Additionally or alternatively, cooling the second portion of the heat engine may include employing a heat sink. Cooling the second portion of the heat engine may include employing an active cooling apparatus. Cooling the second portion of the heat engine may include employing a combination of one or more cooling apparatuses thereof.

According to an embodiment, converting the received energy to generated electricity may include outputting the generated electricity as time-varying generated electricity.

According to various embodiments, applying electrical energy to the combustion reaction may include, for example, applying a voltage to the combustion reaction, a charge to the combustion reaction, and/or an electric field, to the combustion reaction. Applying electrical energy to the combustion reaction may include applying a combination of one or more electric signals to the combustion reaction thereof.

According to various embodiments, applying electrical energy to the combustion reaction may include applying a time-varying voltage to the combustion reaction, a time-varying charge and/or a time-varying electric field, to the combustion reaction. Additionally or alternatively, applying electrical energy to the combustion reaction may include applying a combination of one or more electrical signals to the combustion reaction thereof.

According to various embodiments, applying electrical energy to the combustion reaction may include applying the generated electricity to the combustion reaction. Applying electrical energy the combustion reaction may include powering a power supply with the generated electricity. Additionally, electrical energy to the combustion reaction may include controlling the power supply to apply the electrical energy to the combustion reaction.

According to various embodiments, applying electrical energy to the combustion reaction may include adding a charge to the combustion reaction to increase an electrical potential of the combustion reaction or to create an electrical potential in the combustion reaction. The combustion reaction may include an electrical potential. Applying electrical energy to the combustion reaction may include selecting the electrical energy to interact with an electrical potential of the combustion reaction to cause a measurable effect on the combustion reaction.

The electric field may be exclusively powered by the generated electricity, and may include supporting the combustion reaction. Additionally or alternatively, applying electrical energy to the combustion reaction may include supporting the combustion reaction as a flame. Additionally or alternatively, applying electrical energy to the combustion reaction may include supporting the combustion reaction within the combustion volume. Supporting the combustion reaction within the combustion volume may include receiving the energy at least in part inside the combustion volume. Supporting the combustion reaction within the combustion volume may include converting the energy to the generated electricity that may occur at least in part inside the combustion volume.

The abstract of the present disclosure is provided as a brief outline of some of the principles disclosed, according to one embodiment, and is not intended as a complete or definitive description of any embodiment thereof, nor should it be relied upon to define terms used in the specification or claims. The abstract does not limit the scope of the claims.

While various aspects and embodiments have been disclosed herein, other aspects and embodiments are contemplated. The various aspects and embodiments disclosed herein are for purposes of illustration and are not intended to be limiting, with the true scope and spirit being indicated by the following claims.

What is claimed is:

1. A system for applying electrical energy to a combustion reaction, comprising:
   a dedicated energy converter configured to receive energy from a combustion reaction and output the received energy as generated electricity; and
   an electrodynamic system operatively coupled to receive some portion of the generated electricity from the energy converter and configured to be powered, at least in part, by the generated electricity from the energy converter, and to output electrical energy to the combustion reaction.

2. The system for applying electricity electrical energy to a combustion reaction of claim 1, wherein the dedicated energy converter is configured to output the generated electricity exclusively to the electrodynamic combustion system.

3. The system for applying electrical energy to a combustion reaction of claim 1, wherein the dedicated energy converter includes:
   a turbine rotor configured to convert at least a portion of a flow caused by the energy of the combustion reaction to rotation; and
   an electrical generator configured to generate the generated electricity from the rotation.

4. The system for applying electrical energy to a combustion reaction of claim 3, wherein the flow includes one or more of: a fuel, an oxidant, a combustion reaction product, a flue gas, a carrier gas, steam, air, or a combination thereof.

5. The system for applying electrical energy to a combustion reaction of claim 3, wherein the flow includes a gas flow of the combustion reaction.

6. The system for applying electrical energy to a combustion reaction of claim 1, wherein the dedicated energy converter includes:
   a closed-cycle heat engine configured to convert heating of a working fluid by the energy from the combustion reaction to rotation; and
   an electrical generator configured to generate the generated electricity from the rotation provided by the closed-cycle heat engine.

7. The system for applying electrical energy to a combustion reaction of claim 6, wherein the closed-cycle heat engine includes: a steam engine, a Stirling cycle engine, a Brayton cycle engine, an Ericsson cycle engine, or a Kalina cycle engine.

8. The system for applying electrical energy to a combustion reaction of claim 1, wherein the dedicated energy converter includes an electric energy converter configured to convert the energy in the form of heat to the generated electricity.

9. The system for applying electrical energy to a combustion reaction of claim 8, wherein the electric energy converter includes one or more of: a thermoelectric element, a pyroelectric element, or a thermionic converter.

10. The system for applying electrical energy to a combustion reaction of claim 1, wherein the dedicated energy converter includes a magnetohydrodynamic generator configured to generate the generated electricity from the energy in the form of motion of ions of the combustion reaction.

11. The system for applying electrical energy to a combustion reaction of claim 10, wherein the dedicated energy converter is configured to generate the generated electricity from the energy while substantially maintaining a temperature of the combustion reaction.

12. The system for applying electrical energy to a combustion reaction of claim 1, wherein the dedicated energy converter includes a photoelectric element configured to convert the energy in the form of light emitted by the combustion reaction to the generated electricity.

13. The system for applying electrical energy to a combustion reaction of claim 12, wherein the photoelectric element is configured to convert the energy in the form of infrared light emitted by the combustion reaction to the generated electricity.

14. The system for applying electrical energy to a combustion reaction of claim 1, wherein the dedicated energy converter is electrically isolated from ground.

15. The system for applying electrical energy to a combustion reaction of claim 1, wherein the dedicated energy converter is electrically isolated from any other voltage source.

16. The system for applying electrical energy to a combustion reaction of claim 1, wherein at least a portion of the dedicated energy converter is configured to be located inside a combustion volume configured to support the combustion reaction.

17. The system for applying electrical energy to a combustion reaction of claim 1, wherein the dedicated energy converter includes a heat engine, further comprising a thermal reservoir operatively coupled to at least a portion of the energy converter and configured to provide heat transfer from the combustion reaction through the energy converter to the thermal reservoir.

18. The system for applying electrical energy to a combustion reaction of claim 17, wherein the thermal reservoir includes one or more of a heat pipe, a heat sink, or an active cooling apparatus.

19. The system for applying electrical energy to a combustion reaction of claim 17, wherein:
   at least a portion of the dedicated energy converter is configured to be located in a combustion volume configured to support the combustion reaction; and
   at least a portion of the thermal reservoir is configured to be located outside of the combustion volume.

20. The system for applying electrical energy to a combustion reaction of claim 1, further comprising a thermal protector operatively coupled to at least one of the dedicated energy converter or the electrodynamic system, wherein the thermal protector is configured to protect a portion of the energy converter and/or the electrodynamic system from heat of the combustion reaction.

21. The system for applying electrical energy to a combustion reaction of claim 20, wherein the thermal protector includes one or more of a thermal insulator, a thermal shield, a heat pipe, a heat sink, or an active cooling apparatus.

22. The system for applying electrical energy to a combustion reaction of claim 1, wherein at least a portion of the electrodynamic system is configured to be located in a combustion volume configured to support the combustion reaction.

23. The system for applying electrical energy to a combustion reaction of claim 1, wherein the dedicated energy converter and the electrodynamic system are configured to be substantially located within a combustion volume configured to support the combustion reaction.

24. The system for applying electrical energy to a combustion reaction of claim 1, wherein the electrodynamic system further comprises:
one or more electrodes configured to apply an electric field to the combustion reaction;
a power supply powered by the generated electricity and operatively coupled to the one or more electrodes; and
a controller operatively coupled to the power supply and configured to control the power supply to drive the one or more electrodes to apply the electric field to the combustion reaction.

25. The system for applying electrical energy to a combustion reaction of claim 1, wherein the electrodynamic system further comprises:
one or more electrodes operatively coupled to the dedicated energy converter; and
a controller operatively coupled to the dedicated energy converter, the controller being configured to control the dedicated energy converter to drive the one or more electrodes to apply the electrical energy to the combustion reaction.

26. The system for applying electrical energy to a combustion reaction of claim 1, wherein the electrodynamic system is electrically isolated from ground.

27. The system for applying electrical energy to a combustion reaction of claim 1, wherein the electrodynamic system is electrically isolated from any other voltage source.

28. The system for applying electrical energy to a combustion reaction of claim 1, wherein the electrodynamic system is configured to be exclusively powered by the generated electricity from the dedicated energy converter.

29. The system for applying electrical energy to a combustion reaction of claim 1, wherein the dedicated energy converter is configured to output the generated electricity as time-varying electricity.

30. The system for applying electrical energy to a combustion reaction of claim 1, wherein the electrodynamic system is configured to apply a voltage, a charge, an electric field, or a combination thereof to the combustion reaction.

31. The system for applying electrical energy to a combustion reaction of claim 1, wherein the electrodynamic system is configured to apply a time-varying voltage, a time-varying charge, an electric field as a time-varying electric field, or a combination thereof to the combustion reaction.

32. The system for applying electrical energy to a combustion reaction of claim 1, wherein the electrodynamic system is configured to output a charge to the combustion reaction to increase an electrical potential of the combustion reaction or to create an electrical potential in the combustion reaction.

33. The system for applying electrical energy to a combustion reaction of claim 1, wherein:
the combustion reaction includes an electrical potential; and
the electrodynamic system is configured to apply an electric field to the combustion reaction, the electric field being selected to interact with the an electrical potential to cause a measurable effect on the combustion reaction.

34. The system for applying electrical energy to a combustion reaction of claim 1, further comprising a burner or fuel source configured to support the combustion reaction.

35. The system for applying electrical energy to a combustion reaction of claim 1, further comprising a burner or fuel source configured to support the combustion reaction including a flame.

36. A method for employing electrical energy to control a combustion reaction, comprising:
receiving energy from a combustion reaction;
converting the received energy to electricity; and
employing a substantial portion of the electricity to apply electrical energy to the combustion reaction.

37. The method for employing electrical energy to control a combustion reaction of claim 36, wherein employing a substantial portion of the electricity to apply at least an electrical field to the combustion reaction includes employing substantially an entirety of the electricity.

38. The method for employing electrical energy to control a combustion reaction of claim 36, wherein receiving the energy from the combustion reaction and converting the received energy to electricity includes:
converting at least a portion of a flow motion caused by the energy of the combustion reaction to rotation; and
generating the electricity from the rotation.

39. The method for employing electrical energy to control a combustion reaction of claim 38, wherein the flow includes one or more of: a fuel, an oxidant, a combustion reaction product, a flue gas, a carrier gas, steam, air, or a combination thereof.

40. The method for employing electrical energy to control a combustion reaction of claim 38, wherein the flow includes a gas flow of the combustion reaction.

41. The method for employing electrical energy to control a combustion reaction of claim 38, wherein converting at least a portion of a flow caused by the energy of the combustion reaction to rotation includes:
physically isolating a gas flow from the combustion reaction; and
heating the isolated gas using the energy of the combustion reaction to cause the isolated gas to flow.

42. The method for employing electrical energy to control a combustion reaction of claim 38, further comprising creating at least a portion of the flow by pneumatically or hydraulically flowing a fuel, an oxidant, or a carrier gas to the combustion reaction, wherein at least a portion of the energy of the combustion reaction includes a pneumatic or hydraulic contribution.

43. The method for employing electrical energy to control a combustion reaction of claim 36, wherein receiving the energy from the combustion reaction and converting the received energy to electricity includes:
heating a closed-cycle working fluid using the energy received from the combustion reaction;
converting heat energy in the closed cycle working fluid to rotational energy; and
generating the electricity from the rotational energy.

44. The method for employing electrical energy to control a combustion reaction of claim 36, wherein receiving the energy from the combustion reaction includes employing one or more of: a steam cycle, a Stirling cycle, a Brayton cycle, an Ericsson cycle, or a Kalina cycle.

45. The method for employing electrical energy to control a combustion reaction of claim 36, wherein receiving the energy from the combustion reaction and converting the received energy to the electricity includes receiving the energy in the form of heat and thermoelectrically converting the heat to the electricity.

46. The method for employing electrical energy to control a combustion reaction of claim 36, wherein receiving the energy from the combustion reaction and converting the received energy to the electricity includes receiving the energy in the form of heat and pyroelectrically converting the heat to the electricity.

47. The method for employing electrical energy to control a combustion reaction of claim 36, wherein receiving the energy from the combustion reaction and converting the received energy to the electricity includes receiving the energy in the form of heat and thermoionically converting the heat to the electricity.

48. The method for employing electrical energy to control a combustion reaction of claim 36, wherein receiving the energy from the combustion reaction and converting the received energy to the electricity includes magnetohydrodynamically capturing the energy as carried by a flow of ions of the combustion reaction and outputting the energy as the electricity.

49. The method for employing electrical energy to control a combustion reaction of claim 36, wherein receiving the energy from the combustion reaction and converting the received energy to the electricity includes receiving the energy from the combustion reaction in the form of light and photoelectrically converting the received energy to the electricity.

50. The method for employing electrical energy to control a combustion reaction of claim 49, wherein the light includes infrared light.

51. The method for employing electrical energy to control a combustion reaction of claim 36, wherein receiving the energy from the combustion reaction includes employing a heat engine, further comprising:
    supporting the combustion reaction within a combustion volume;
    heating a first portion of the heat engine within the combustion volume and cooling a second portion of the heat engine outside the volume;
    outputting rotation from the heat engine; and
    generating the electricity from the rotation.

52. The method for employing electrical energy to control a combustion reaction of claim 51, wherein cooling the second portion of the heat engine includes employing one or more of a heat pipe, a heat sink, or an active cooling apparatus.

53. The method for employing electrical energy to control a combustion reaction of claim 36, wherein converting the received energy to electricity includes outputting the electricity as time-varying electricity.

54. The method for employing electrical energy to control a combustion reaction of claim 36, wherein applying electrical energy to the combustion reaction includes applying a voltage, a charge, an electric field, or a combination thereof to the combustion reaction.

55. The method for employing electrical energy to control a combustion reaction of claim 36, wherein applying electrical energy to the combustion reaction includes a time-varying voltage, a time-varying charge, an electric field as a time-varying electric field, or a combination thereof to the combustion reaction.

56. The method for employing electrical energy to control a combustion reaction of claim 36, wherein applying electrical energy to the combustion reaction includes applying the electricity to the combustion reaction.

57. The method for employing electrical energy to control a combustion reaction of claim 36, wherein applying at least electrical energy to the combustion reaction includes powering a power supply with the electricity; and controlling the power supply to apply the electrical energy to the combustion reaction.

58. The method for employing electrical energy to control a combustion reaction of claim 36, wherein applying electrical energy to the combustion reaction includes adding a charge to the combustion reaction to create or increase an electrical potential of the combustion reaction.

59. The method for employing electrical energy to control a combustion reaction of claim 36, wherein:
    the combustion reaction includes an electrical potential; and
    applying electrical energy to the combustion reaction includes selecting the electrical energy to interact with the electrical potential of the combustion reaction to cause a measurable effect on the combustion reaction.

60. The method for employing electrical energy to control a combustion reaction of claim 36, wherein the electrical energy is exclusively powered by the electricity.

61. The method for employing electrical energy to control a combustion reaction of claim 36, further comprising supporting the combustion reaction.

62. The method for employing electrical energy to control a combustion reaction of claim 36, further comprising supporting the combustion reaction as a flame.

63. The method for employing electrical energy to control a combustion reaction of claim 36, further comprising supporting the combustion reaction within a combustion volume, wherein receiving the energy occurs at least in part inside the combustion volume.

64. The method for employing electrical energy to control a combustion reaction of claim 36, further comprising supporting the combustion reaction within a combustion volume, wherein converting the energy to the electricity occurs at least in part inside the combustion volume.

65. A system for applying electrical energy to a combustion reaction, comprising:
    an energy converter configured to receive energy from a combustion reaction of a combustion system and output the received energy as generated electricity; and
    an electrodynamic system operatively coupled to receive the generated electricity from the energy converter and configured to output an electric field to the combustion reaction,
    the electrodynamic system being configured to be powered, at least in part, by the generated electricity from the energy converter, and
    the generated electricity being electrically isolated from connections external to the combustion system.

66. A method for employing electrical energy to control a combustion reaction, comprising:
    receiving energy from a combustion reaction;
    converting the received energy to generated electricity;
    electrically isolating the generated electricity from external power connections; and
    applying, to the combustion reaction, an electric field powered by the generated electricity.

67. A combustion control system, comprising:
    an energy converter configured to receive energy in a form produced by a combustion reaction; and
    an electrodynamic system operatively coupled to the energy converter, configured to receive a substantial portion of the generated electricity and to output electrical energy to the combustion reaction.

68. A combustion control system, comprising:
    an electrodynamic system having an input configured to receive electricity, configured to output electrical energy to a combustion reaction;

an energy converter having an output operatively coupled to the input of the electrodynamic system, configured to receive waste energy produced by a combustion reaction and to produce sufficient generated electricity from the waste energy to power the electrodynamic system.

69. A combustion control system, comprising:
an energy converter configured to receive energy in a form produced by a combustion reaction; and
an electrodynamic system operatively coupled to the energy converter, configured to receive generated electricity directly from the energy converter, and to output electricity to the combustion reaction.

* * * * *

UNITED STATES PATENT AND TRADEMARK OFFICE
CERTIFICATE OF CORRECTION

PATENT NO. : 9,574,767 B2
APPLICATION NO. : 14/901668
DATED : February 21, 2017
INVENTOR(S) : Kraig K. Anderson et al.

Page 1 of 1

It is certified that error appears in the above-identified patent and that said Letters Patent is hereby corrected as shown below:

In the Claims

In Claim 2, Column 11, Line 22 of the patent, "2. The system for applying electricity electrical energy to" should read --2. The system for applying electrical energy to--.

Signed and Sealed this
Eleventh Day of April, 2017

Michelle K. Lee
*Director of the United States Patent and Trademark Office*